United States Patent
Zhan et al.

(10) Patent No.: US 11,980,017 B2
(45) Date of Patent: May 7, 2024

(54) CAPACITOR STRUCTURE AND ITS FORMATION METHOD AND MEMORY

(71) Applicant: CHANGXIN MEMORY TECHNOLOGIES, INC., Hefei (CN)

(72) Inventors: Kangshu Zhan, Hefei (CN); Qiang Wan, Hefei (CN); Penghui Xu, Hefei (CN); Tao Liu, Hefei (CN); Sen Li, Hefei (CN); Jun Xia, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 380 days.

(21) Appl. No.: 17/451,493

(22) Filed: Oct. 20, 2021

(65) Prior Publication Data

US 2023/0018954 A1 Jan. 19, 2023

Related U.S. Application Data

(63) Continuation of application No. PCT/CN2021/108910, filed on Jul. 28, 2021.

(30) Foreign Application Priority Data

Jul. 16, 2021 (CN) .............. 202110807908

(51) Int. Cl.
*H10B 12/00* (2023.01)
*H01L 49/02* (2006.01)

(52) U.S. Cl.
CPC ........... *H10B 12/033* (2023.02); *H01L 28/92* (2013.01); *H10B 12/315* (2023.02)

(58) Field of Classification Search
CPC .................... H10B 12/033; H10B 12/315
See application file for complete search history.

(56) References Cited

U.S. PATENT DOCUMENTS

| | | | | |
|---|---|---|---|---|
| 5,930,639 A | * | 7/1999 | Schuele | ............ H01L 21/32136 257/E21.011 |
| 2006/0046382 A1 | | 3/2006 | Yoon et al. | |

(Continued)

FOREIGN PATENT DOCUMENTS

| | | |
|---|---|---|
| CN | 208738232 U | 4/2019 |
| CN | 208753321 U | 4/2019 |
| CN | 112928069 A | 6/2021 |

OTHER PUBLICATIONS

International Search Report cited in PCT/CN2021/108910, mailed Apr. 1, 2022, 9 pages.

*Primary Examiner* — Robert G Bachner
*Assistant Examiner* — Molly K Reida
(74) *Attorney, Agent, or Firm* — Cooper Legal Group, LLC

(57) ABSTRACT

The present disclosure discloses a capacitor structure and its formation method and a memory. The method includes: providing a substrate; forming an electrode support structure on the substrate in a stacking fashion, wherein the electrode support structure includes at least a first support layer on its top, a capacitor hole is formed at intervals within the electrode support structure and extends upwards in a direction perpendicular to a surface of the substrate; forming, within the capacitor hole, an electrode post and an electrode layer extending from the electrode post to the upper surface of the first support layer; removing the electrode layer; removing the first support layer; forming a dielectric layer on the top of the electrode support structure, wherein the dielectric layer covers the top of the electrode post, and an outer peripheral wall of the top of the electrode post is connected with the dielectric layer.

10 Claims, 7 Drawing Sheets

(56) References Cited

U.S. PATENT DOCUMENTS

| | | | |
|---|---|---|---|
| 2012/0211813 A1* | 8/2012 | Taketani | H01L 29/1095 257/296 |
| 2014/0120683 A1* | 5/2014 | Kim | H10B 12/318 438/381 |
| 2022/0189960 A1* | 6/2022 | Kaneko | H10B 12/31 |

* cited by examiner

CAPACITOR STRUCTURE AND ITS FORMATION METHOD AND MEMORY

CROSS-REFERENCE TO RELATED APPLICATIONS

This application is a continuation application of International Application No. PCT/CN2021/108910, filed on Jul. 28, 2021, which is based upon and claims the priority to Chinese Patent Application No. 202110807908.3, filed on Jul. 16, 2021. International Application No. PCT/CN2021/108910 and Chinese Patent Application No. 202110807908.3 are incorporated herein by reference in their entireties.

TECHNICAL FIELD

The present disclosure relates to the technical field of manufacturing integrated circuits and electronic components, and in particular, to a capacitor structure and its formation method and a memory.

BACKGROUND

A memory is a memory component configured to store programs and various kinds of data information, and may be classified into a read-only memory and a random access memory according to the type of the memory used. The memory generally includes a capacitor and a transistor connected with the capacitor, wherein the capacitor is configured to store charges representing stored information, and the transistor is a switch controlling inflow and release of the charges in the capacitor.

As a process node of the memory is being scaled down in size, in the prior art, a bottom electrode of the capacitor formed in a capacitor hole easily falls off when an advanced dynamic random access memory (DRAM) is manufactured.

SUMMARY

In a first aspect of the present disclosure, a formation method for a capacitor structure is provided. The formation method includes the following steps: providing a substrate; forming an electrode support structure on the substrate in a stacking fashion, wherein the electrode support structure includes at least a first support layer on its top, a capacitor hole is formed at intervals within the electrode support structure and extends upwards in a direction perpendicular to a surface of the substrate; forming, within the capacitor hole, an electrode post and an electrode layer extending from the electrode post to an upper surface of the first support layer; removing the electrode layer; removing the first support layer; forming a dielectric layer on the top of the electrode support structure, wherein the dielectric layer covers the top of the electrode post, and an outer peripheral wall of the top of the electrode post is connected with the dielectric layer.

In a second aspect of the present disclosure, a capacitor structure is provided. The capacitor structure is formed by any of the formation methods for the capacitor structure.

In a third aspect of the present disclosure, a memory is provided. The memory includes the above-mentioned capacitor structure.

DETAILED DESCRIPTION

In order to make the objectives, the technical solutions, and the advantages of the present disclosure clearer, the present disclosure will be described in detail in conjunction with the detailed description and with reference to accompanying drawings. It should be understood that these descriptions are only exemplary and are not intended to limit the scope of the present disclosure. In addition, in the following description, descriptions of well-known structures and technologies will be omitted to avoid unnecessarily obscuring the concept of the present disclosure.

Unless otherwise defined, all of the technical and scientific terms used herein have the same meanings as would generally understood by those skilled in the technical field of the present disclosure. Herein, the terms used in the description of the present disclosure is merely for the purpose of describing particular embodiments, and is not intended to limit the present disclosure.

It should be understood that the terms "first", "second" and the like used in the present disclosure may be used herein to describe various elements, but these elements are not limited by these terms. These terms merely serve to distinguish a first element from another element. By way of an example, a first resistor may be referred to as a second resistor and similarly the second resistor may be referred to as the first resistor without departing from the scope of the present disclosure. Both the first resistor and the second resistor are resistors, but they are not the same resistor.

The expression in the singular form of "a", "an" and "said/the" when being used herein will cover the expression in the plural form unless otherwise indicated obviously from the context. It should also be understood that the terms "comprising/including" or "having" and the like specify the presence of the stated features, integers, steps, operations, components, parts or groups thereof, but do not preclude the presence or addition of one or more other features, integers, steps, operations, components, parts or groups thereof. Meanwhile, the term "and/or" used in this specification includes any and all combinations of related listed items.

It may be known from the background that in the related art, when an advanced dynamic random access memory (DRAM) is manufactured, a bottom electrode of a capacitor formed in a capacitor hole is easy to fall off.

Figure 1:
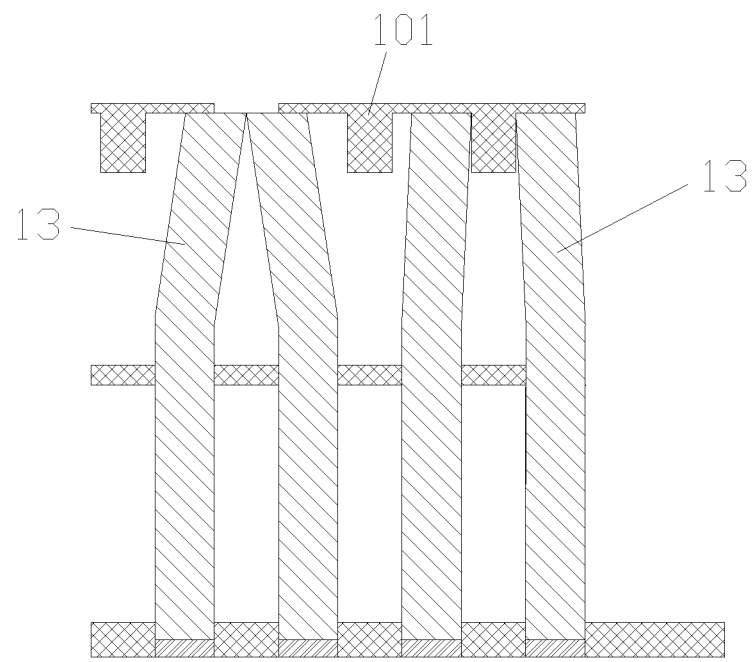
FIG. 1 is a schematic structural diagram 1 of a capacitor structure in the related art.

FIG. 1 is a schematic structural diagram 1 of a capacitor structure in the related art. With reference to FIG. 1, a gap is formed between an outer peripheral wall of the top of an electrode post 13 and a first support layer 101. The first support layer 101 is incapable of fixing the electrode post 13, which easily causes the electrode post 13 to tilt and further deform and fall off from a surface of the first support layer 101.

To solve the above technical problems, according to a first aspect of the present disclosure, a formation method for a capacitor structure is provided. The formation method includes the following steps: forming, within a capacitor hole 11, an electrode post 13 and an electrode layer 106 extending from the electrode post 13 to an upper surface of the first support layer 101; removing the electrode layer 106; removing the first support layer 101; forming a dielectric layer 108 on the top of the electrode support structure, wherein the dielectric layer 108 covers the top of the electrode post 13, and an outer peripheral wall of the top of the electrode post 13 is connected with the dielectric layer 108. No gap exists between the dielectric layer 108 and the outer peripheral wall of the electrode post 13. The dielectric layer 108 is capable of completely fixing the top of the electrode post 13, and the electrode post 13 is in close contact with the dielectric layer 108, which may prevent the electrode post 13 from tilting and further deforming, such that the electrode post 13 is difficult to fall off.

In order to make the objectives, the technical solutions, and the advantages of the embodiments of the present disclosure clearer, the embodiments of the present disclosure will be described below in combination with the accompanying drawings. Those ordinarily skilled in the art may understand that many technical details are provided in the embodiments of the present disclosure so as to make the readers better understand the present disclosure. However, even if these technical details are not provided and based on a variety of variations and modifications of the following embodiments, the technical solutions sought for protection in the present disclosure may also be realized.

Figure 10:
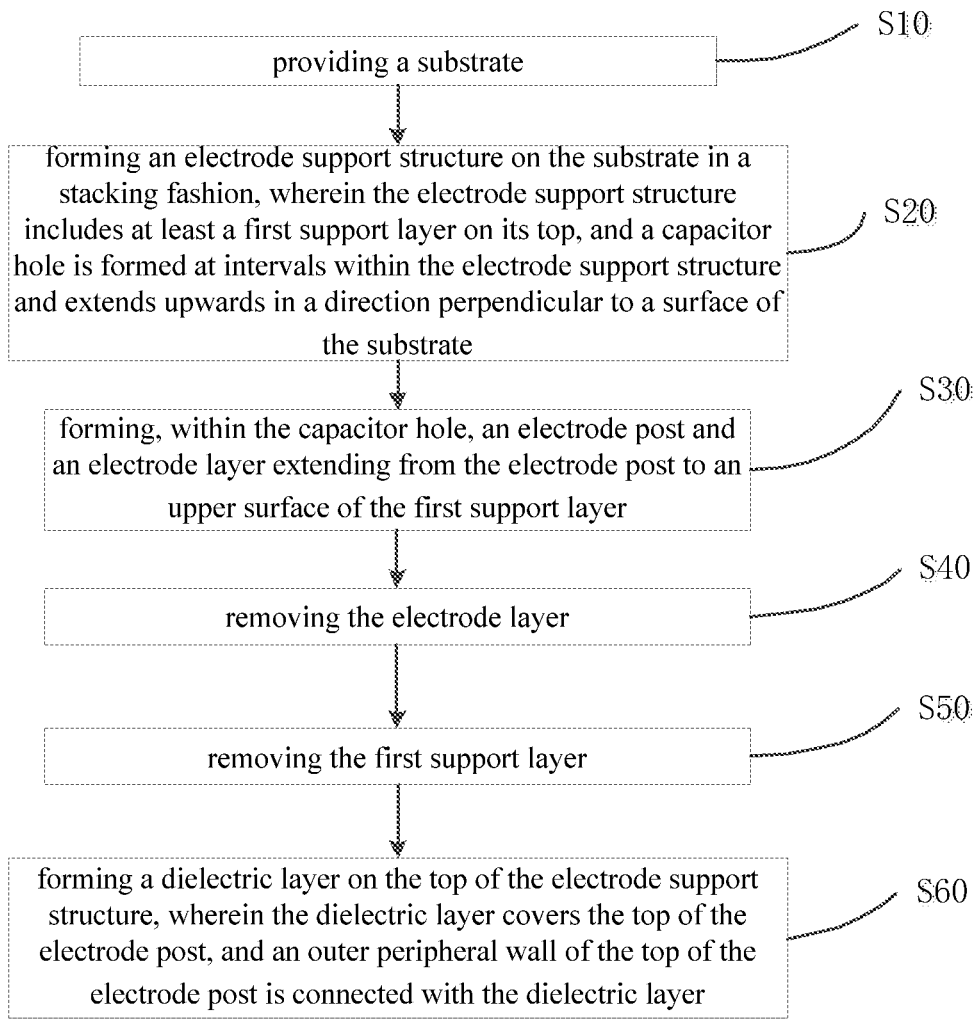
FIG. 10 is a flowchart of a formation method for a capacitor structure according to an embodiment of the present disclosure.

FIG. 10 is a flowchart of a formation method for a capacitor structure according to an embodiment of the present disclosure. With reference to FIG. 10, in some embodiments of the present disclosure, a formation method for a capacitor structure is provided. The formation method may include the following steps:

S10, providing a substrate, wherein the substrate is metal silicide.

S20, forming an electrode support structure on the substrate in a stacking fashion, wherein the electrode support structure includes at least a first support layer 101 on its top, and a capacitor hole 11 is formed at intervals within the electrode support structure and extends upwards in a direction perpendicular to a surface of the substrate. The first support layer 101 is silicon nitride or silicon carbon nitride. During a process of forming the capacitor hole 11, the sidewall of the first support layer 101 exposed to the capacitor hole 11 is easily oxidized to form an oxide layer 107, and the oxide layer 107 is an oxide layer 107 of silicon carbon nitride.

S30, forming, within the capacitor hole 11, an electrode post 13 and an electrode layer 106 extending from the electrode post 13 to an upper surface of the first support layer 101. Within the capacitor hole 11, the electrode post 13 is formed by utilizing a deposition process, and the electrode layer 106 extending from the electrode post 13 to the upper surface of the first support layer 101 is formed; and the electrode layer 106 is formed on the upper surface of the first support layer 101, and the electrode post 13 and the electrode layer 106 are made of titanium nitride and the like.

S40, removing the electrode layer 106, wherein the electrode layer 106 on the top may be removed by utilizing an etch-back process, by this time, the electrode post 13 shrinks due to an inherent stress, such that the outer peripheral wall of the top of the electrode post 13 is of a trapezoidal morphology, that is, the electrode post 13 gradually shrinks upwards in a direction perpendicular to the first silicon oxide layer 102. Accordingly, the outer peripheral wall of the electrode post 13 is separated from the oxide layer 107 within the first support layer 101.

S50, removing the first support layer 101, wherein the first support layer 101 and its oxide layer 107 may be removed by utilizing a wet etch process. An etching solution selected during the wet etch process includes hot phosphoric acid, which is capable of completely removing the oxide layer 107 generated when the capacitor hole 11 is formed on the first support layer 101. In this case, the stress on the top end of the electrode post 13 is completely released, such that the electrode post 13 is in good close contact with the subsequently formed dielectric layer 108 wrapping its surface, and the support stability of the electrode post 13 by the dielectric layer 108 is fully realized.

S60, forming a dielectric layer 108 on the top of the electrode support structure, wherein the dielectric layer 108 covers the top of the electrode post 13 and the outer peripheral wall of the top of the electrode post 13 is connected with the dielectric layer 108. The dielectric layer 108 is further deposited on the first silicon oxide layer 102, and made of silicon carbon nitride. The dielectric layer 108 is gradually grown upwards on the first silicon oxide layer 102 in a redeposition fashion until the dielectric layer 108 is grown to an original position of the electrode layer 106 in a deposition fashion. The dielectric layer 108 covers the top of the electrode post 13 and is capable of fixing the electrode post 13, in order to prevent the electrode post 13 from tilting and further separating from the dielectric layer 108. Moreover, the oxide layer 107 of silicon carbon nitride is difficultly formed on the surface of the dielectric layer 108 in contact with the electrode post 13, and the stress of the electrode post 13 is completely released. Accordingly, the electrode post 13 is difficult to fall off. In some embodiments, the dielectric layer 108 is formed by employing at least one of chemical vapor deposition, physical vapor deposition and atomic layer deposition.

The formation method for the capacitor structure according to the embodiment of the present disclosure is simple and easy to operate, and may enable no gap to exist between the dielectric layer 108 and the outer peripheral wall of the electrode post 13. The dielectric layer 108 is capable of completely fixing the top of the electrode post 13, and the electrode post 13 is in close contact with the dielectric layer 108, which may prevent the electrode post 13 from tilting and further deforming, such that the electrode post 13 is difficult to fall off.

Figure 11:
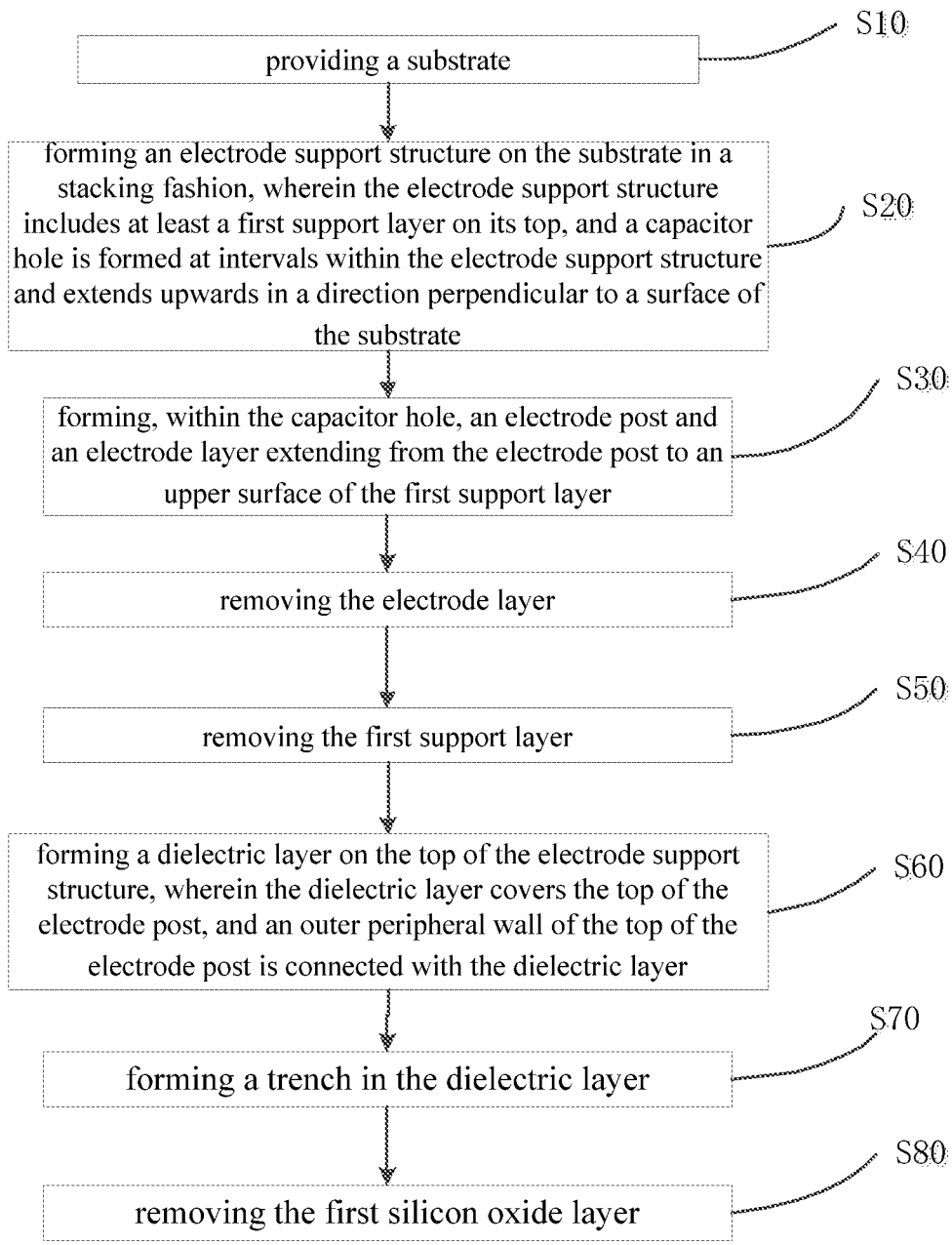
FIG. 11 is a flowchart of a formation method for a capacitor structure according to another embodiment of the present disclosure.

FIG. 11 is a flowchart of a formation method for a capacitor structure according to another embodiment of the present disclosure. With reference to FIG. 11, in another embodiment of the present disclosure, a formation method for a capacitor structure is provided. Subsequent to the step S60, the formation method may further include the following steps:

S70, forming a trench 14 in the dielectric layer 108, wherein the trench 14 exposes the surface of the electrode support structure, the trench 14 is located between two adjacent electrode posts 13; and/or the trench 14 is located in one side of the electrode post 13. Before the trench 14 is formed on the dielectric layer 108, a mask layer 109 may be formed on the top of the dielectric layer 108, and the trench 14 may be opened on the dielectric layer 108 by using a photolithographic imaging process of mesh holes.

S80, removing the first silicon oxide layer 102, wherein the first silicon oxide layer 102 may be removed by utilizing a wet etch process. In some embodiments, the first silicon oxide layer 102, the second support layer 103 and the dielectric layer 108 are made of different materials, and have different etch rates in the same etching solution. Particularly, in the same etching solution, a rate at which the first silicon oxide layer 102 is etched is much greater than a rate at which the second support layer 103 and the dielectric layer 108 are etched, so as to ensure that when the first silicon oxide layer 102 is completely removed, the second support layer 103 and the dielectric layer 108 may be completely retained or nearly completely retained. Accordingly, the etching solution selected during the wet etch process may be an acidic solution.

FIG. 2 to FIG. 9 are schematic structural diagrams corresponding to steps in a formation method for a capacitor structure according to an embodiment of the present disclosure. Hereinafter, the steps of the embodiment of the present disclosure will be described in detail with reference to FIG. 2 to FIG. 9.

Figure 2:
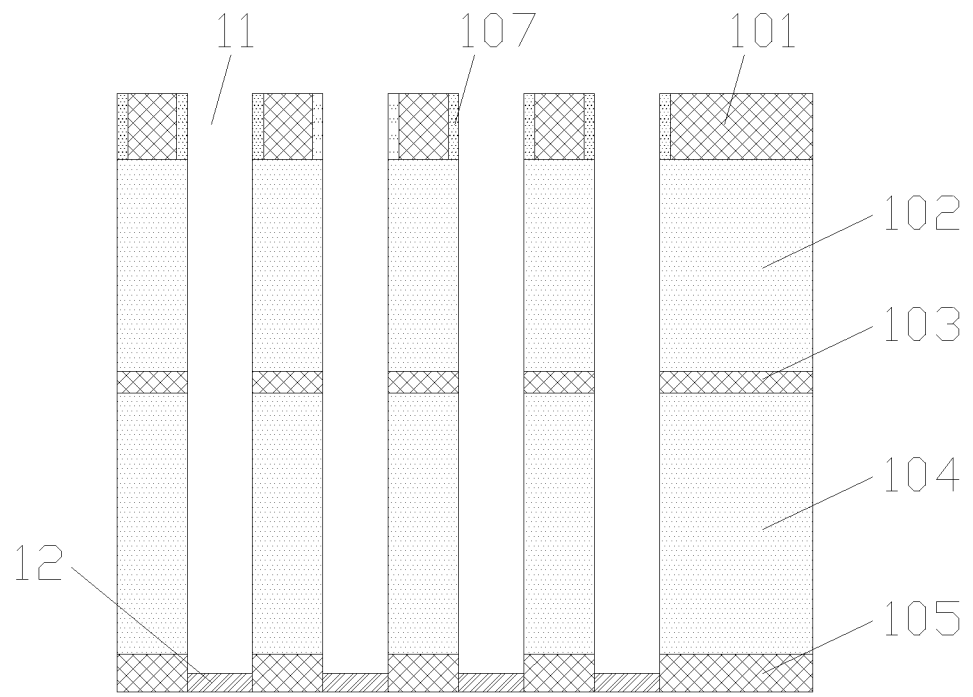
FIG. 2 to FIG. 9 are schematic structural diagrams corresponding to steps in a formation method for a capacitor structure according to an embodiment of the present disclosure.

With reference to FIG. 2, a substrate (not shown in FIG. 2) is provided, and an electrode support structure is formed on the substrate. The electrode support structure includes a third support layer 105, a second silicon oxide layer 104, a second support layer 103, a first silicon oxide layer 102 and a first support layer 101 that are sequentially formed from bottom to top in a stacking fashion in a longitudinal direction, and a capacitor hole 11 is at intervals formed in the electrode support structure along the longitudinal direction. It should be understood that the third support layer 105 is formed on the substrate. The first support layer 101, the second support layer 103 and the third support layer 105 are made of silicon nitride or silicon carbon nitride. The second silicon oxide layer 104 is made of borophosphosilicate glass (BPSG). The first silicon oxide layer 102 is made of tetraethyl orthosilicate (TEOS). A landing pad 12 is formed at the bottom of the capacitor hole 11, and the landing pad 12 is made of a conductive material such as tungsten or titanium. During a process of forming the capacitor hole 11, the sidewall of the first support layer 101 exposed to the capacitor hole 11 is easily oxidized to form an oxide layer 107, and the oxide layer 107 is an oxide layer 107 of silicon carbon nitride.

Figure 3:
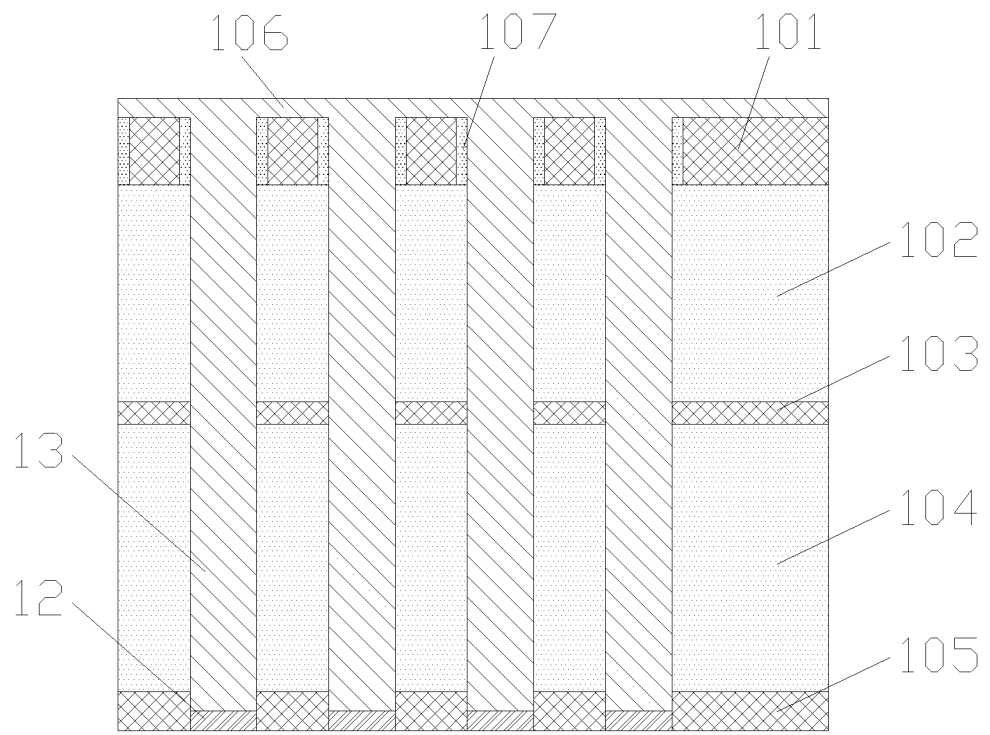

With reference to FIG. 3, within the capacitor hole 11, an electrode post 13 is formed by utilizing a deposition process, and an electrode layer 106 extending from the electrode post 13 to an upper surface of the first support layer 101 is formed. The electrode layer 106 is formed on the upper surface of the first support layer 101. The material electrode post 13 and the electrode layer 106 are made of titanium nitride and the like.

Figure 4:
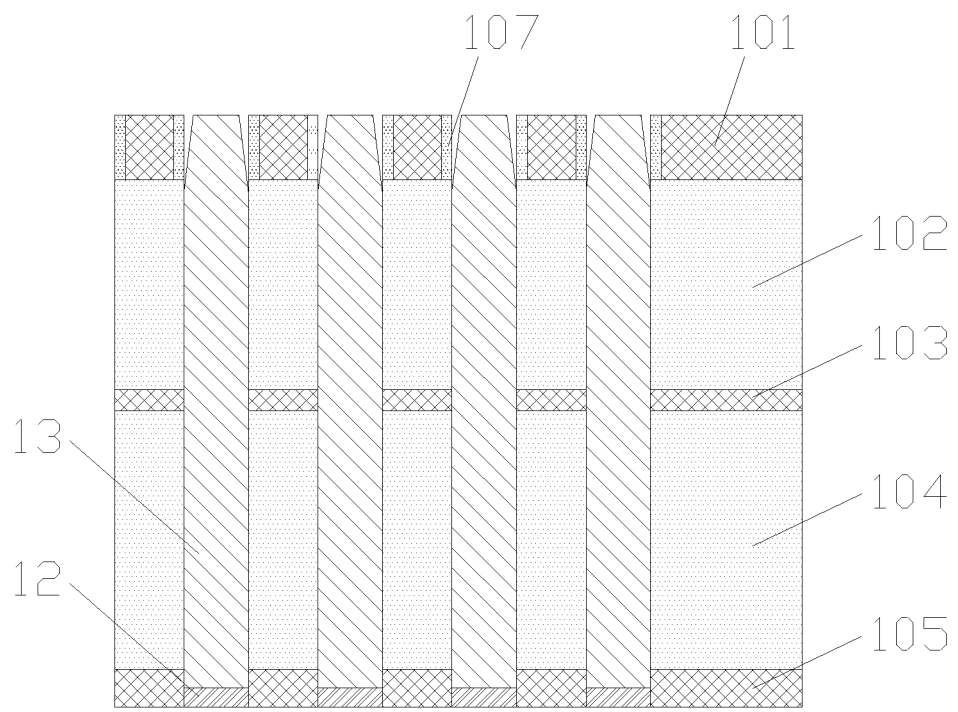

With reference to FIG. 4, the electrode layer 106 on its top is removed by utilizing an etch-back process. In this case, the electrode post 13 shrinks due to an inherent stress, such that the outer peripheral wall of the top of the electrode post 13 is of a trapezoidal morphology, that is, the electrode post 13 gradually shrinks upwards in a direction perpendicular to the first silicon oxide layer 102. Accordingly, the outer peripheral wall of the electrode post 13 is separated from the oxide layer 107 within the first support layer 101.

Figure 1A:
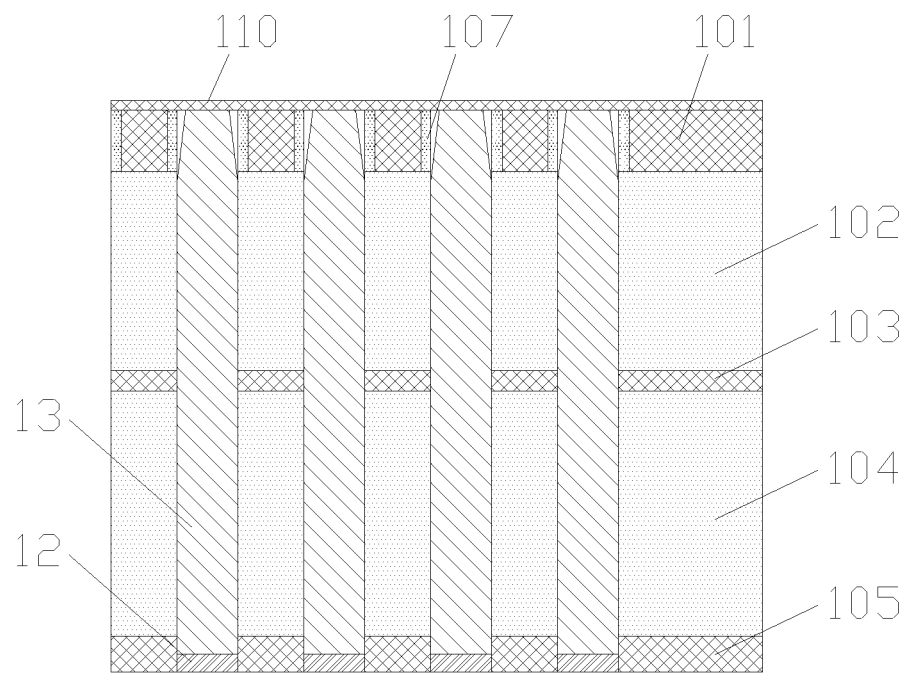
FIG. 1a is a schematic structural diagram 2 of the capacitor structure in the related art.

In general, based on the reference to FIG. 4, with reference to FIG. 1a, silicon carbon nitride is directly deposited on the first support layer 101 to form a fourth support layer 110, and the fourth support layer 110 has a thickness equal to the original thickness of the electrode layer 106. The electrode post 13 is separated from the oxide layer 107 on the outer peripheral wall of the electrode post 13 within the first support layer 101. If the oxide layer 107 is removed, a gap between the outer peripheral wall of the electrode post 13 and the first support layer 101 becomes larger, such that the first support layer 101 is incapable of fixing the electrode post, and the electrode post 13 is easy to tilt and further deform and fall off. With reference to FIG. 1, if a trench 14 is opened between two adjacent electrode posts 13, when the first support layer 101 is incapable of fixing the outer peripheral wall of the electrode post 13, the electrode post 13 will tilt and further deform, and even two adjacent electrode posts 13 will be in contact with each other.

Figure 5:
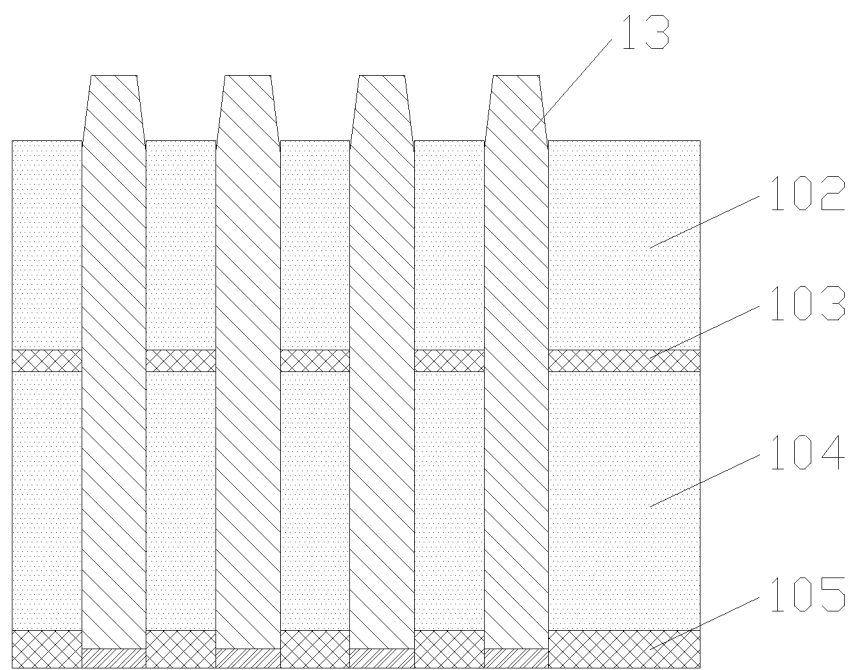

With reference to FIG. 5, the first support layer 101 and its oxide layer 107 are removed by utilizing a wet etch process. An etching solution selected during the wet etch process includes hot phosphoric acid, which is capable of completely removing the oxide layer 107 generated when the capacitor hole 11 is formed on the first support layer 101. In this case, the stress on the top end of the electrode post 13 is completely released, such that the electrode post 13 has a better close contact area with the subsequently formed dielectric layer 108 covering its surface, and the support stability of the electrode post 13 by the dielectric layer 108 is fully realized.

Particularly, the first support layer 101 is made of silicon nitride or silicon carbon nitride. The electrode post 13 is made of titanium nitride. The first silicon oxide layer 102 is made of tetraethyl orthosilicate (TEOS). In some embodiments, since the first support layer 101, the electrode post 13 and the first silicon oxide layer 102 are made of different materials, and have the same etch rate in the same etching solution. Accordingly, an etching solution selected during the wet etch process may be hot phosphoric acid. The etch rate of the first support layer 101 and its oxide layer 107 by the hot phosphoric acid is much greater than that of the first silicon oxide layer 102 and the electrode post 13 by the hot phosphoric acid, and a ratio of the etch rates is greater than 50:1, so as to ensure that when the first support layer 101 and its oxide layer 107 are completely removed, the first silicon oxide layer 102 and the electrode post 13 may be completely retained or nearly completely retained.

Figure 6:
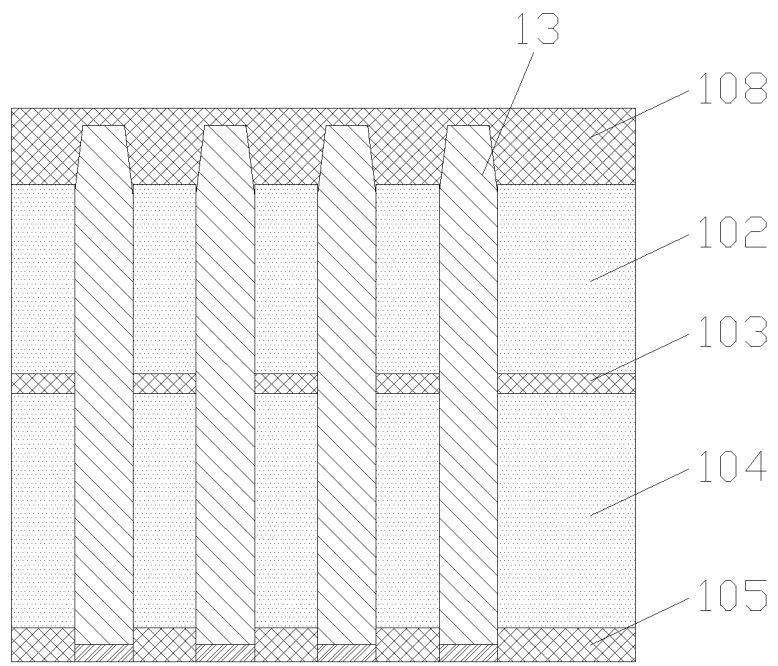

With reference to FIG. 6, a dielectric layer 108 is further re-deposited on the first silicon oxide layer 102. The dielectric layer 108 is made of silicon carbon nitride. The dielectric layer 108 is gradually grown upwards on the first silicon oxide layer 102 in a redeposition fashion until the dielectric layer 108 is grown to an original position of the electrode layer 106 in a deposition fashion. The dielectric layer 108 covers the top of the electrode post 13 and is capable of fixing the electrode post 13, in order to prevent the electrode post 13 from tilting and further separating from the dielectric layer 108. Moreover, the oxide layer 107 of silicon carbon nitride is difficultly formed on the surface of the dielectric layer 108 in contact with the electrode post 13, and the stress of the electrode post 13 is completely released. Accordingly, the electrode post 13 is difficult to fall off. In some embodiments, the dielectric layer 108 is formed by employing at least one of chemical vapor deposition, physical vapor deposition and atomic layer deposition.

Figure 7:
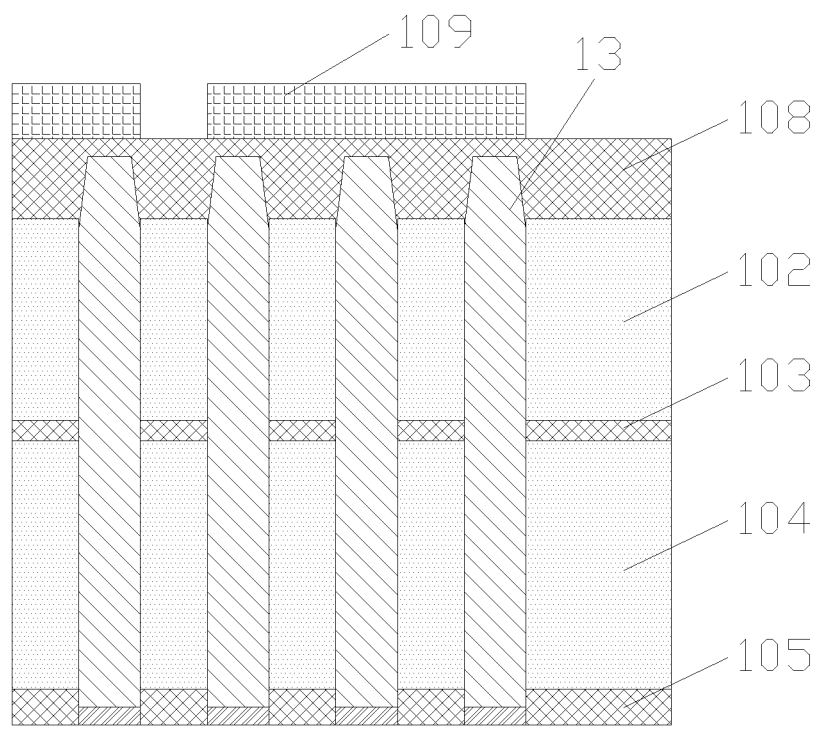

With reference to FIG. 7, a mask layer 109 is formed on the top of the dielectric layer 108, and a trench 14 is opened in the dielectric layer 108 by using a photolithographic imaging process of mesh holes. In an exemplary embodiment, the mask layer 109 is firstly formed on the upper surface of the dielectric layer 108, and then the mask layer 109 is patterned. A pattern formed by the patterned mask layer 109 and a projection of the trench 14 on the upper surface of the dielectric layer 108 coincide. In this way, the dielectric layer 108 is directionally etched downwards in the direction perpendicular to the surface of the dielectric layer 108 through the exposed upper surface of the dielectric layer 108, such that the trench 14 may be formed within the dielectric layer 108.

Figure 8:
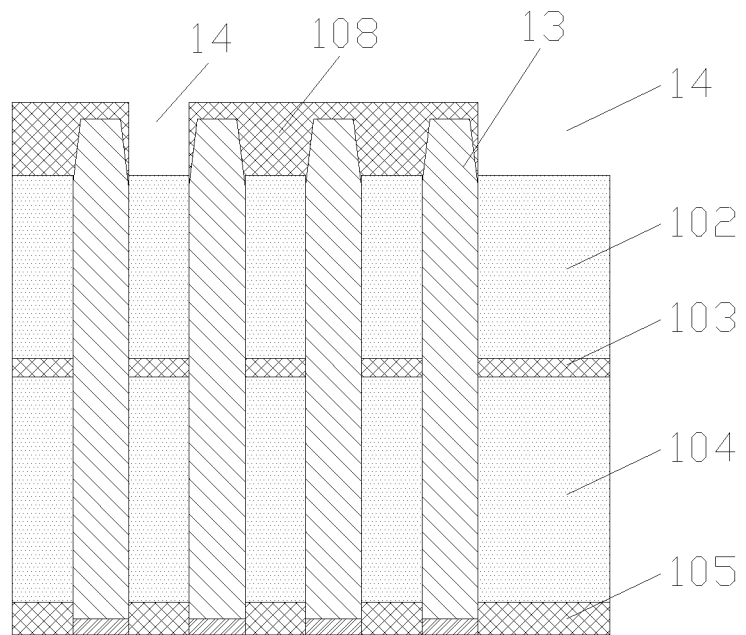

With reference to FIG. 8, the trench 14 formed within the dielectric layer 108 may be located between two adjacent electrode posts 13, and/or the trench 14 may be located in one side of the electrode post 13.

Figure 9:
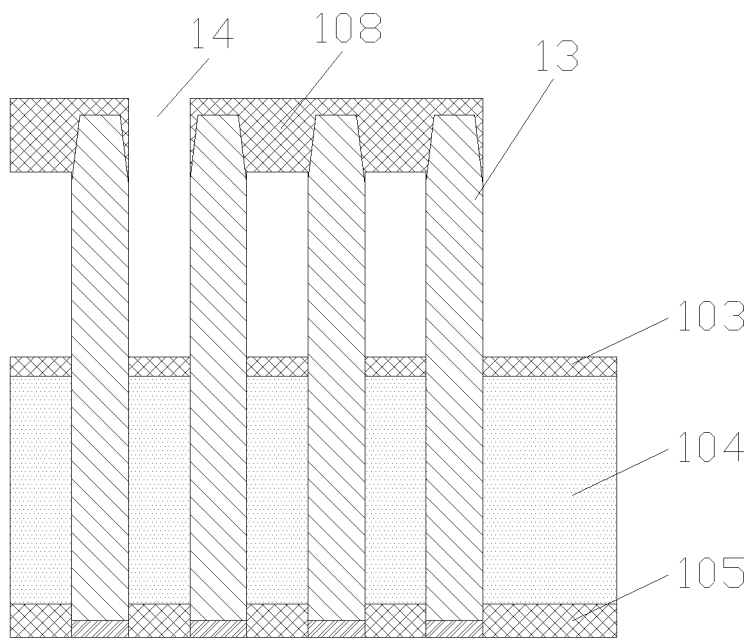

With reference to FIG. 9, the first silicon oxide layer 102 is removed by utilizing a wet etch process. In some embodiments, the first silicon oxide layer 102, the second support layer 103 and the dielectric layer 108 are made of different materials, and have the same etching rate in the same etching solution. Particularly, in the same etching solution, the rate at which the first silicon oxide layer 102 is etched is much greater than the rate at which the second support layer 103 and the dielectric layer 108 are etched, so as to ensure that when the first silicon oxide layer 102 is completely removed, the second support layer 103 and the dielectric layer 108 may be completely retained or nearly completely retained. Accordingly, the etching solution selected during the wet etch process may be an acidic solution.

In some embodiments, the second support layer 103 and the dielectric layer 108 are made of silicon nitride, and the etching solution includes a hydrofluoric acid solution. The first silicon oxide layer 102 is doped with boron or phosphorus, so as to ensure the uniformity of critical dimensions and increase the etch rate when the first silicon oxide layer 102 is wet-etched.

According to a second aspect of the present disclosure, a capacitor structure is provided. The capacitor structure is formed by using the method in the foregoing embodiment.

In an embodiment of the present disclosure, with reference to FIG. 9, the capacitor structure includes a substrate (not shown in FIG. 9); an electrode support structure disposed on the substrate, wherein a capacitor hole 11 is formed at intervals within the electrode support structure and extends upwards in a direction perpendicular to the surface of the substrate; an electrode post 13 disposed within the capacitor hole 11 and exposed out of the electrode support structure; and a dielectric layer 108 covering the top of the electrode post 13, wherein the outer peripheral wall of the top of the electrode post 13 is connected with the dielectric layer 108. The electrode support structure is disposed on the upper surface of the substrate. A landing pad 12 is disposed at the bottom of the capacitor hole 11 and made of a conductive material such as tungsten or titanium. The bottom of the electrode post 13 is connected with the landing pad 12. The electrode post 13 is made of titanium nitride and the like. The dielectric layer 108 is made of silicon carbon nitride. No gap exists between the dielectric layer 108 and the outer peripheral wall of the electrode post 13. The dielectric layer 108 is capable of completely fixing the top of the electrode post 13, and the electrode post 13 is in close contact with the dielectric layer 108, which may prevent the electrode post 13 from tilting and further deforming, such that the electrode post 13 is difficult to fall off.

In some embodiments, the dielectric layer 108 is provided with a trench 14, which exposes the surface of the electrode support structure, and the trench 14 is located between two adjacent electrode posts 13; and/or the trench 14 is located in one side of the electrode post 13. The trench 14 exposes the upper surface of the second support layer 103.

In some embodiments, the electrode support structure includes a third support layer 105, a second silicon oxide layer 104 and a second support layer 103 that are sequentially disposed on the substrate from bottom to top in a stacking fashion. The second supporting layer 103 and the third supporting layer 105 are made of silicon nitride or silicon carbon nitride. The second silicon oxide layer 104 is made of borophosphosilicate glass (BPSG).

According to a third aspect of the present disclosure, a memory is provided. The memory includes the above-mentioned capacitor structure.

In the embodiment of the present disclosure, the first support layer and its oxide layer are removed, wherein the oxide layer is an oxide layer of silicon carbon nitride. Moreover, the dielectric layer is formed on the top of the electrode support structure, and the dielectric layer may cover the top of the electrode post, such that no gap exists between the dielectric layer and the outer peripheral wall of the electrode post. In this way, the dielectric layer is capable of completely fixing the top of the electrode post, which may prevent the electrode post from tilting and further deforming, such that the electrode post is difficult to fall off and the yield of the capacitor structure may be increased.

It should be understood that the foregoing detailed description of the present disclosure merely serves to exemplify or explain the principle of the present disclosure and not intended to limit the present disclosure. Any modifications, equivalent substitutions, improvements and the like made without departing from the protection scope of the present disclosure should be included in the protection scope of the present disclosure. Also, the appended claims of the present disclosure are intended to cover all changes and modifications that fall within the scope and boundary of the appended claims, or equivalent forms of such scope and boundary.

What is claimed is:

1. A formation method for a capacitor structure, comprising:
   providing a substrate;
   forming an electrode support structure on the substrate in a stacking fashion, wherein the electrode support structure comprises at least a first support layer on a top of the electrode support structure, capacitor holes are formed at intervals within the electrode support structure and extend upward in a direction perpendicular to a surface of the substrate;
   forming an electrode post within at least one of the capacitor holes and an electrode layer extending from the electrode post to an upper surface of the first support layer;
   removing the electrode layer;
   removing the first support layer, wherein removing the first support layer comprises:
      forming an oxide layer between the first support layer and the electrode post; and
      removing the oxide layer while removing the first support layer by a wet etch process, wherein an etching solution employed in the wet etch process comprises hot phosphoric acid; and
   forming a dielectric layer on the top of the electrode support structure, wherein the dielectric layer covers a top of the electrode post, and an outer peripheral wall of the top of the electrode post is connected with the dielectric layer.

2. The formation method for a capacitor structure according to claim 1, after the dielectric layer is formed on the top of the electrode support structure, further comprising:
   forming a trench in the dielectric layer, wherein the trench exposes a surface of the electrode support structure and the trench is located between two adjacent electrode posts; or
   the trench is located at one side of the electrode post.

3. The formation method for a capacitor structure according to claim 2, wherein
   forming the electrode support structure on the substrate in the stacking fashion comprises: sequentially forming a third support layer, a second silicon oxide layer, a second support layer and a first silicon oxide layer on the substrate from bottom to top in the stacking fashion, wherein the first silicon oxide layer is formed between the first support layer and the second support layer.

4. The formation method for a capacitor structure according to claim 3, after the trench is formed in the dielectric layer, further comprising:
   removing the first silicon oxide layer.

5. The formation method for a capacitor structure according to claim 3, wherein after the electrode layer is removed, the top of the electrode post shrinks from bottom to top within the first support layer; and after the first support layer is removed, the dielectric layer is gradually grown upwards on the first silicon oxide layer in a redeposition fashion until an original position of the electrode layer is filled up.

6. The formation method for a capacitor structure according to claim 1, wherein the dielectric layer is formed by employing at least one of chemical vapor deposition, physical vapor deposition or atomic layer deposition.

7. The formation method for a capacitor structure according to claim 1, wherein a landing pad is formed on a bottom of the at least one of the capacitor holes, and the electrode post is formed on the landing pad.

8. The formation method for a capacitor structure according to claim 1, wherein the electrode post is made of titanium nitride.

9. The formation method for a capacitor structure according to claim 1, wherein the dielectric layer is made of titanium nitride or silicon carbon nitride.

10. The formation method for a capacitor structure according to claim 3, wherein a first etch rate of the first support layer and the oxide layer by the hot phosphoric acid is greater than a second etch rate of the first silicon oxide layer and the electrode post by the hot phosphoric acid, and a ratio of the first etch rate to the second etch rate is greater than 50:1.

* * * * *